United States Patent
Reichel et al.

(10) Patent No.: US 9,002,667 B2
(45) Date of Patent: Apr. 7, 2015

(54) MULTI-PATH POWER METER WITH AMPLIFIER

(75) Inventors: Thomas Reichel, Baldham (DE); Toralf Bratfisch, Putzbrunn (DE); Michael Katzer, Munich (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 739 days.

(21) Appl. No.: 12/579,753

(22) Filed: Oct. 15, 2009

(65) Prior Publication Data

US 2010/0100340 A1    Apr. 22, 2010

(30) Foreign Application Priority Data

Oct. 20, 2008  (DE) .................. 10 2008 052 335

(51) Int. Cl.
G01R 21/00 (2006.01)
G01R 21/06 (2006.01)
G01R 15/08 (2006.01)
G01R 21/12 (2006.01)

(52) U.S. Cl.
CPC ............... *G01R 15/08* (2013.01); *G01R 21/12* (2013.01)

(58) Field of Classification Search
CPC ........ G01R 15/08; G01R 21/12; G01R 21/133
USPC ........................................................ 702/61
See application file for complete search history.

(56) References Cited

U.S. PATENT DOCUMENTS

| | | | | |
|---|---|---|---|---|
| 4,348,638 A | * | 9/1982 | Boldridge, Jr. | 324/127 |
| 4,628,256 A | * | 12/1986 | Powell | 324/95 |
| 4,873,484 A | * | 10/1989 | Adam | 324/95 |
| 6,291,984 B1 | * | 9/2001 | Wong et al. | 324/132 |
| 6,331,769 B1 | * | 12/2001 | Wong et al. | 324/132 |
| 6,794,881 B1 | * | 9/2004 | Reichel et al. | 324/522 |
| 6,803,754 B2 | * | 10/2004 | Bratfisch et al. | 324/95 |
| 6,903,542 B2 | * | 6/2005 | Ives | 324/95 |
| 2002/0039021 A1 | * | 4/2002 | Wong et al. | 324/103 P |
| 2005/0046409 A1 | * | 3/2005 | Ives | 324/95 |
| 2008/0084199 A1 | * | 4/2008 | Hawkins et al. | 324/74 |
| 2008/0116878 A1 | * | 5/2008 | Nicholson | 324/95 |
| 2008/0143320 A1 | * | 6/2008 | Nicholson | 324/96 |
| 2009/0189593 A1 | | 7/2009 | Bratfisch et al. | |
| 2009/0322313 A1 | * | 12/2009 | Zhang et al. | 324/123 R |

FOREIGN PATENT DOCUMENTS

| | | |
|---|---|---|
| DE | 19955342 A1 | 5/2001 |
| DE | 102006046966 A1 | 11/2007 |
| DE | 102007047009 A1 | 5/2008 |
| EP | 1043595 A1 | 10/2000 |
| GB | 2325989 A | 12/1998 |

OTHER PUBLICATIONS

Physics 623, The Difference Amplifier, Sep. 28, 2006, pp. 1-10.*

* cited by examiner

*Primary Examiner* — John Breene
*Assistant Examiner* — Yaritza H Perez Bermudez
(74) *Attorney, Agent, or Firm* — Marshall, Gerstein & Borun LLP

(57) ABSTRACT

A power meter comprises at least two measurement paths and distribution device. A first measurement path contains at least one pre-amplifier and a first detector. A second measurement path contains at least one direct connection and a second detector. An additional third path alternative to or optional to the second path contains at least one attenuation element and a second or respectively third detector. The distribution device distributes a test signal to the measurement paths.

10 Claims, 1 Drawing Sheet

MULTI-PATH POWER METER WITH AMPLIFIER

BACKGROUND OF THE INVENTION

1. Field of the Invention

The invention relates generally to a power meter and, in particular, the invention relates to a high-frequency power meter with a large dynamic range.

2. Related Technology

Traditionally, diode power meters are used among others for measuring the power of high-frequency signals. A test signal is supplied to a detector diode. Because of the quadratic characteristic of the detector diode, an analog output voltage of the detector diode proportional to the power of the signal can be obtained.

However, with the use of a single detector, a small dynamic range of the power meter is obtained, because this operates only within the square law region of the detector diode. If the square law region is fully exploited, a reduction in the accuracy of measurement is additionally obtained at the limit of the square law region.

In response to this problem, DE 10 2007 047 009 A1 discloses a power meter with several measurement paths, which are designed for different power ranges of the test signal. In this context, the test signal is switched between the different measurement paths by a first switch at the input end. At the same time, exactly one measurement path is always active. Digitization of the test results is implemented after the combination of the measurement paths by means of an output-end, second switch. However, this power meter is associated with some disadvantages. For instance, signals with a rapid alternation between power ranges cannot be measured in a satisfactory manner, because the switches provide a switching latency. The properties of mechanical switches (for example, micro-mechanical MEMS switches) can vary subject to environmental influences and ageing. In particular, the contact resistance can increase. This results in a reduced accuracy of measurement.

SUMMARY OF THE INVENTION

The invention provides a power meter, which measures the power of test signals with high accuracy, small space requirement and low manufacturing costs.

Accordingly, the invention provides a power meter with at least two measurement paths and a distribution device, wherein a first measurement path contains at least one pre-amplifier and a first detector, a second measurement path contains at least one direct connection and a second detector and/or a third measurement path contains at least one attenuation element and a second or respectively third detector, wherein the distribution device distributes a test signal to the measurement paths.

Thus, a power meter according to the invention provides at least two measurement paths and a distribution device. A first measurement path contains at least one pre-amplifier and a first detector. A second measurement path contains at least one direct connection and a second detector. An additional third path alternative to or optional to the second path contains at least one attenuation element and a second or respectively third detector. The distribution device distributes a test signal to the measurement paths. Accordingly, a switch for the combination of the signals of the measurement paths can be dispensed with. A high accuracy and speed of measurement is possible in this manner.

The distribution device preferably distributes test signals to the measurement paths dependent upon the power of the test signals. The accuracy of the measurement can be increased in this manner.

The distribution device preferably is a passive network. This guarantees low complexity and good security against failure of the power measurement.

The passive network preferably contains at least one power divider. The test signal can therefore be divided uniformly over several measurement paths.

Preferably, the passive network distributes the test signals of the power meter continuously to the measurement paths. Accordingly, at the transition from one measurement path to the other measurement path, the output voltages of several measurement paths can be evaluated at the same time. This increases the accuracy of measurement.

As an alternative, the distribution device may be a switch. In this manner, more complex distributions of the signals to the measurement paths can be realized. Furthermore, a second, output-end switch can be dispensed with.

Preferably, every measurement path contains an AD-converter. This means that a combination of the signals, especially output voltages of the measurement paths, can be dispensed with. An increase in the accuracy of measurement is possible in this manner.

Preferably, every measurement path contains a chopper. This means that zero errors of other components of the measurement paths can be compensated.

Preferably, every measurement path contains a difference amplifier. Accordingly, the test signals, especially the output voltages of the measurement paths, can be brought, especially amplified, to an optimum level for digitisation.

The detectors of the measurement paths preferably are optimized for different power ranges. For example, the dynamic range of the power meter can be significantly increased. Level adaptations of the divided test signals can be reduced in this manner. Accordingly, the noise level can be reduced, and the accuracy of measurement increased. Alternatively, the detectors of the measurement paths can also be identical. This means that simple, standard components can be used. This reduces the manufacturing costs of the power meter.

The power meter preferably contains a digital signal-processing device, which processes all signals of all measurement paths. A digital signal-processing device preferably processes the test signals of all measurement paths in a time-parallel manner. Accordingly, the power measurement values of the different measurement paths can be combined to form an accurate, common power-measurement value.

The power meter advantageously contains exactly one distribution device. Accordingly, a combination of the signals through a second distribution device can be dispensed with.

The power meter preferably contains two measurement paths. The first measurement path preferably measures a power of a test signal from −110 dBm to +10 dBm, more preferably from −87 dBm to −15 dBm. The second or respectively third measurement path preferably measures a power of test signal from −45 dBm to +50 dBm, more preferably from −35 dBm to +26 dBm. Test signals of very different powers can be measured in this manner.

Alternatively, the power meter may contain three measurement paths. The first measurement path preferably measures a power of a test signal from −110 dBm to −10 dBm, more preferably from −87 dBm to −31 dBm. The second measurement path preferably measures a power of a test signal from −50 dBm to +10 dBm, more preferably from −37 dBm to −4 dBm. The third measurement path preferably measures a power of a test signal from −25 dBm to +50 dBm, more preferably from −10 dBm to +26 dBm. Test signals of very different powers can be measured with high precision in this manner.

BRIEF DESCRIPTION OF THE DRAWINGS

By way of example, the invention is described below with reference to the drawings, which present an advantageous exemplary embodiment of the invention. The drawings are as follows.

DETAILED DESCRIPTION

The structure and function of the power meter according to the invention is explained below with reference to FIGS. 1 and 2. The presentation and description of identical elements in similar drawings is not repeated in some cases.

Figure 1:
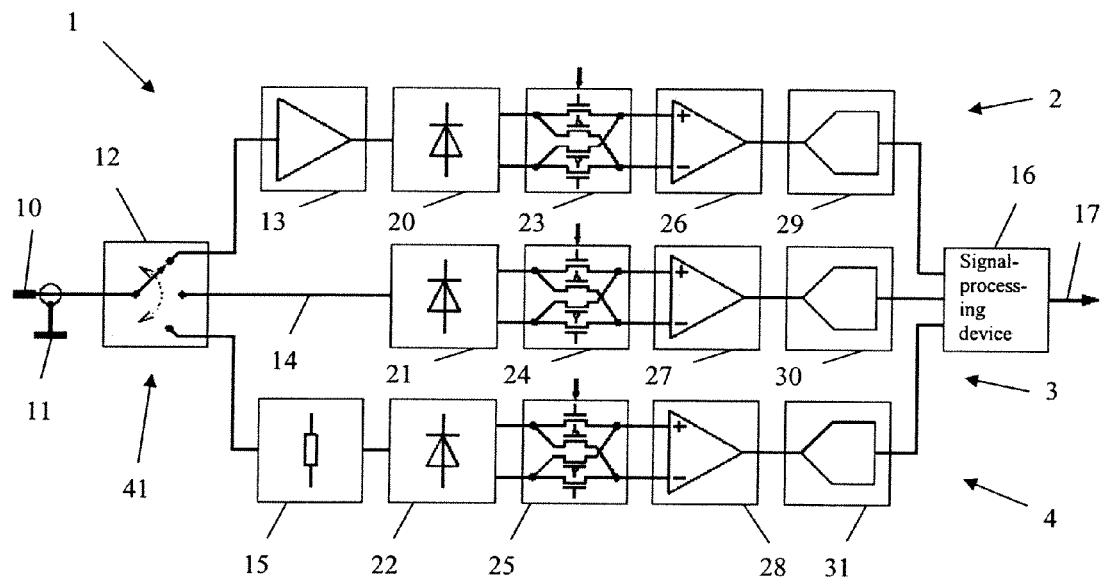
FIG. 1 shows a first exemplary embodiment of the power meter according to the invention.

FIG. 1 shows a first exemplary embodiment of the power meter 1 according to the invention. The power meter 1 contains an input connection 10, a ground connection 11, a distribution device 41, several measurement paths 2, 3, and 4, a digital signal-processing device 16, and an output connection 17. In this exemplary embodiment, the distribution device 41 comprises a switch 12.

All of the measurement paths 2, 3, and 4 contain respectively one detector 20, 21, or 22, respectively one chopper 23, 24, or 25, respectively one difference amplifier 26, 27, or 28 and one analog/digital converter 29, 30, or 31. The first measurement path 2 contains a pre-amplifier 13. The second measurement path 3 contains a direct connection 14. The third measurement path 4 contains an attenuation element 15.

A high-frequency signal is supplied via the input connection 10. The screening of the line, by means of which the high-frequency signal is supplied, is connected in this context to the ground connection 11. Dependent upon the level of the high-frequency signal, the switch 12 switches the high-frequency signal to one of the measurement paths 2, 3, or 4. In the case of a signal of low level, the first measurement path 2 is selected. In the case of a signal of middle level, the second measurement path 3 is selected. In the case of a signal of high level, the third measurement path 4 is selected. A low level is raised by the pre-amplifier 13. A middle level is not influenced by the direct connection 14. A high level is weakened by the attenuation element 15.

In this manner, the level of a test signal on the individual measurement paths 2, 3, or 4 is changed before the actual measurement in the detector 20, 21, or 22 to a more readily measurable level. The detectors 20, 21, and 22 of the individual measurement paths 2, 3, and 4 in this exemplary embodiment are of identical structure. The detectors therefore also provide an identical characteristic, which provides a square law region. The change to the level of the test signal is implemented by operating each detector within its respective square law region. As an alternative, detectors can be used, of which the characteristics provide square law regions at different levels. This means that the change of the level implemented in advance may be relatively lower.

After a rectification of the test signal has been implemented by the respectively-used detector 20, 21, and 22, the rectified test signal is routed to the respective chopper 23, 24, and 25. This multiplies the signal by a rectangular signal of the value +1 and −1. This step is used to compensate zero errors of the amplifier 26, 27, or 28 and the analog/digital converter 29, 30, or 31 of the respective measurement path 2, 3, or 4. The chopped test signal is then routed to the amplifier 26, 27, and 28 of the respective measurement path 2, 3, and 4, which amplifier is preferably a difference amplifier. This raises the level of the signal to an optimum level for the subsequent analog/digital conversion. The signal is routed to the analog/digital converter 29, 30, or 31 of the respective measurement path 2, 3, or 4. This digitizes the signal and communicates the signal to the digital signal-processing device 16. This compensates the implemented amplifications and attenuations in a computational manner and outputs the signal via the output connection 17. Accordingly, the output signals, especially the output voltages of the analog/digital converters 29, 30, and 31, are processed in the signal-processing device 16 in parallel by separate conditioning circuits.

Through the use of separate detectors 20, 21, and 22 and separate analog/digital converters 29, 30, and 31, it is possible to dispense with an output-end switch. This avoids the negative effects of an output-end switch on the accuracy and speed of the measurement.

Figure 2:
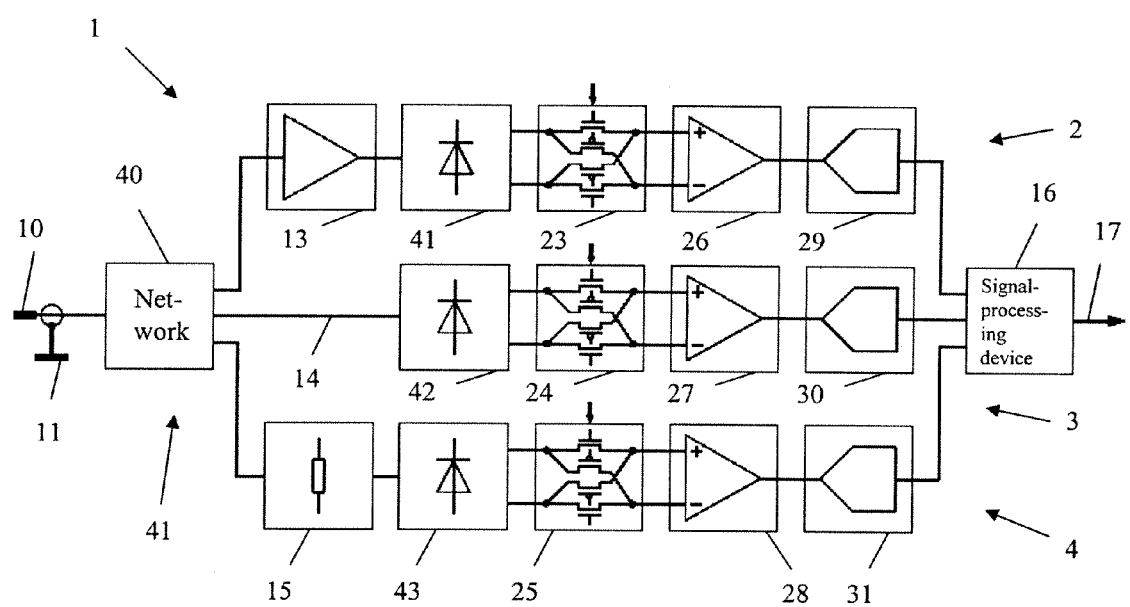
FIG. 2 shows a second exemplary embodiment of the power meter according to the invention.

FIG. 2 shows a second exemplary embodiment of the power meter 1 according to the invention. The power meter 1 illustrated corresponds to a large extent to the power meter 1 from FIG. 1. However, the power meter 1 shown here does not contain a switch 12 as in FIG. 1. Instead, the distribution device 41 is formed by a passive network 40. The use of an active network would also be possible in principle. The passive network 40 contains at least one power divider, which distributes the test signal to the three measurement paths 2, 3, and 4. In this context, the distribution of the measurement signal over three measurement paths 2, 3, and 4 can be implemented as in the case of FIG. 1; that is to say, exactly one measurement path 2, 3, and 4 is active in each case. Moreover, a second alternative is presented. In this case, several measurement paths 2, 3, and 4 are active at the same time. Signal components of low level are processed by the first measurement path 2. Signal components of middle level are processed by the second measurement path 3. Signal components of high-level are processed by the third measurement path 4. By contrast with the detectors 20, 21, and 22 presented in FIG. 1, detectors 41, 42, and 43 presented in FIG. 2 provide different characteristics. Accordingly, only slight changes of the level of the test signal in the individual measurement paths 2, 3, and 4 are required.

The measurement accuracy can be further increased through the use of the passive network 40. On the one hand, an input-end switch can be dispensed with. This avoids negative effects of the switch on the test signal. Moreover, an input-end switch would also have further negative effects on the long-term stability of the power meter 1. It could also impair the input matching.

In particular, the subdivision of the test signal over the measurement paths 2, 3, and 4 with continuous and/or soft power-range limits leads to a significant increase in measurement accuracy, because an optimal measurement is implemented respectively for signal components of different level.

The invention is not restricted to the exemplary embodiment presented. As mentioned above, the power meter according to the invention can also be constructed with only two measurement paths. An expansion to more than three measurement paths is also possible. All of the features described above or illustrated in the drawings can be advantageously combined with one another as required within the framework of the invention.

The invention claimed is:

1. A power meter comprising:
   a first measurement path that contains at least one pre-amplifier and a first detector; and
   a second measurement path that contains at least one direct connection and a second detector;
   and/or a third measurement path that contains at least one attenuation element and a second or respectively third detector;
   a distribution device adapted to activate one or more measurement paths dependent upon the power of test signals and distribute the test signals to the one or more activated measurement paths; and
   a digital signal processing device adapted to process the test signals of all activated measurement paths in a time-parallel manner so that power measurement values of the different measurement paths are combined to form a common power-measurement value.

2. The power meter according to claim 1, wherein every measurement path contains a chopper.

3. The power meter according to claim 1, wherein every measurement path contains a difference amplifier.

4. The power meter according to claim 1, wherein the detectors of the measurement paths are optimized for different power ranges.

5. The power meter according to claim 1, wherein the detectors of the measurement paths are identical.

6. The power meter according to claim 1, wherein
   the power meter contains two measurement paths,
   the first measurement path measures a power of a test signal from −110 dBm to +10 dBm, and
   the second or third measurement path measures a power of the test signal from −45 dBm to +50 dBm.

7. The power meter according to claim 1, wherein
   the power meter contains three measurement paths,
   the first measurement path measures a power of a test signal from −110 dBm to −10 dBm,
   the second measurement path measures a power of the test signal from −50 dBm to +10 dBm, and
   the third measurement path measures a power of the test signal from −25 dBm to +50 dBm.

8. The power meter according to claim 1, wherein
   the power meter contains two measurement paths,
   the first measurement path measures a power of a test signal from −87 dBm to −15 dBm, and
   the second or third measurement path measures a power of the test signal from −35 dBm to +26 dBm.

9. The power meter according to claim 1, wherein
   the power meter contains three measurement paths,
   the first measurement path measures a power of a test signal from −87 dBm to −31 dBm,
   the second measurement path measures a power of the test signal −37 dBm to −4 dBm, and
   the third measurement path measures a power of the test signal from −10 dBm to +26 dBm.

10. The power meter according to claim 1, wherein every measurement path of the power meter contains an analog/digital converter.

* * * * *